(12) United States Patent
Matsuba

(10) Patent No.: US 6,472,014 B1
(45) Date of Patent: Oct. 29, 2002

(54) UNIFORM SURFACE TEXTURING FOR PVD/CVD HARDWARE

(75) Inventor: Stanley Matsuba, San Ramon, CA (US)

(73) Assignee: Novellus Systems, Inc., San Jose, CA (US)

( * ) Notice: Subject to any disclaimer, the term of this patent is extended or adjusted under 35 U.S.C. 154(b) by 35 days.

(21) Appl. No.: 09/836,398

(22) Filed: Apr. 17, 2001

(51) Int. Cl.[7] .............................. B05D 1/36; B05D 1/38
(52) U.S. Cl. .................. 427/202; 427/203; 427/204; 427/205; 427/421; 427/427; 427/470; 427/375
(58) Field of Search .................. 427/180, 201–205, 427/421, 427, 163.4, 470, 459, 461, 375–376.8, 379; 428/627, 651, 654, 661, 698, 699

(56) References Cited

U.S. PATENT DOCUMENTS

| | | | |
|---|---|---|---|
| 2,430,534 A | * | 11/1947 | Rodli |
| 2,668,787 A | * | 2/1954 | Schramm, Jr. |
| 3,378,361 A | * | 4/1968 | Harris, Jr. |
| 3,508,890 A | * | 4/1970 | Fontanella |
| 3,513,012 A | * | 5/1970 | Point et al. |
| 3,591,350 A | * | 7/1971 | Stareck et al. |
| 4,959,255 A | * | 9/1990 | Suzuki |
| 5,473,111 A | | 12/1995 | Hattori et al. |
| 5,945,213 A | * | 8/1999 | Nagaike et al. |
| 5,997,956 A | | 12/1999 | Hunt et al. |
| 6,030,509 A | | 2/2000 | Fu-Kang et al. |
| 6,136,165 A | | 10/2000 | Moslehi |

* cited by examiner

Primary Examiner—Fred J. Parker
(74) Attorney, Agent, or Firm—DeLio & Peterson, LLC

(57) ABSTRACT

A method is provided for texturing the surface of a substrate to enhance the adhesion and to reduce the stress concentration of coatings applied to the substrate. In one embodiment, a first layer of first spheres is applied to the substrate to provide a textured surface onto which is deposited a second layer of larger second spheres. The layered substrate is then reflowed to melt the first layer of first spheres so that the second layer of second spheres is embedded in the formed first reflowed layer and which second layer of second spheres protrudes above the top of the reflowed layer and forms a textured surface corresponding to the shape of abutted and/overlapping second spheres. In another embodiment, the first layer of first spheres is reflowed and then a second layer of second spheres deposited thereon. The first layer is then again reflowed embedding the second spheres therein. The textured substrate may then be coated with any suitable material using any suitable process to form a coated substrate article such as a shield used in a PVD or CVD process.

16 Claims, 2 Drawing Sheets

UNIFORM SURFACE TEXTURING FOR PVD/CVD HARDWARE

BACKGROUND OF THE INVENTION

1. Field of the Invention

This invention relates to the deposition of material onto a substrate and, more particularly, to a method for texturing the surface of a substrate to enhance the adhesion and reduce the stress concentration of a deposit on the substrate surface and the method is useful to deposit metals onto substrates used as shields in PVD and CVD chambers.

2. Description of Related Art

The deposition of a material onto a substrate to provide a coated surface is important for a number of industrial processes including painting, metal plating of electronic components, protecting the substrate from corrosion and the like. There are a number of coating processes used in industry such as painting, electrolytic and electroless plating, chemical vapor deposition (CVD) and physical vapor deposition (PVD). Regardless of the deposition process however, it is important that the substrate surface to be coated has a surface texture or other surface properties so that the deposit will not peel from the surface and be tightly held to the surface.

It is generally preferred that the surface of the substrate to be coated has a texture which enhances the adhesion of the deposit. Various techniques have been used to provide a textured surface such as sand or grit blasting, chemical cleaning or treatment to etch the surface as with acid and other corrosive type materials, adhesives, etc. Once the surface has been textured, the desired deposition material may be applied to the surface by any conventional method including brushing, spraying, dipping, roll coating, electrostatic coating or deposition, immersion, and the like.

Unfortunately, many of the texturing processes are not commercially satisfactory and/or present environmental problems because of the use of dangerous materials requiring safe and environmental disposal after use. While the present invention will be applicable to prepare any surface for deposition of a coating on the surface thereof the following description will be directed to the making of coated shields used in CVD and PVD chambers.

In the fabrication of semiconductor devices, a frequently used technique involves deposition of a metallic layer on the surface of a wafer. A physical vapor deposition (PVD) apparatus as shown in U.S. Pat. No. 6,030,509 to Fu Kang et al. may be used to deposit metal films on wafer surfaces and the disclosure of this patent is hereby incorporated by reference. The PVD apparatus is generally termed a sputtering apparatus and a wafer is placed inside a vacuum chamber and positioned on a wafer holder. The wafer holder is normally supported on the bottom wall of the vacuum chamber by insulating means and the vacuum chamber is further equipped with a sputtering gas inlet which is connected to a gas supply such as argon or other inert gases. A gas outlet is also provided in the chamber and it is connected to an evacuation pump to maintain the desired pressure within the chamber during the metal deposition process.

A target of a suitable metallic material is mounted to the top wall of the chamber and is electrically connected to the negative terminal of a power supply. The chamber further includes a cylindrical chamber shield which typically has top extensions adjacent to the edges of the metal target and bottom extensions which overlap the bottom edge of the wafer holder. During the process the target is energized and metal particles are ejected from the target and coat the wafer. The wafer holder in combination with the chamber shield protects the lower chamber cavity of the PVD chamber from the metal particles ejected from the target during the deposition process. Such contamination of the lower chamber is undesirable since cleaning of the cavity requires a substantial downtime.

The shields can be removed for cleaning and reused and are typically made from stainless steel or aluminum. Stainless steel provides a more durable shield than aluminum.

The shield substrate typically has a deposit on the surface thereof to enhance the life of the shield and it is important that the deposition material on the shield substrate be tightly adhered thereto to reduce the shedding of particles of the deposit onto the wafer during the process. Reducing stress concentrations in the deposit also reduces shedding of particles during thermal history (thermal expansions and contractions) of the PVD or CVD process.

The common method to make the shields is to grit blast the shield substrate (roughen the surface for adhesion) and aluminum arc spraying. The aluminum arc spraying applies a surface with pronounced protrusions for the deposition material such as titanium, tantalum, copper, titanium nitride, aluminum, as well as various other metal films to cover and adhere to the shield substrate. During thermal changes, the underlying aluminum surface is ductile and allows the deposition material to contract or expand with minimal fracturing. Fracturing and poor adhesion are the main contributors to shedding particles. A textured surface that minimizes stress concentrations in the deposit but still allows good adhesion and thermal properties is ideal for reducing shielding particle shedding during the PVD or CVD process.

Bearing in mind the problems and deficiencies of the prior art, it is therefore an object of the present invention to provide a method for preparing a surface of a substrate for deposition of a material thereon, such as a substrate used for a shield in a PVD or CVD process to increase the adhesion and/or lower the stress concentration of materials deposited on the surface of the substrate.

It is another object of the present invention to provide a substrate which has been prepared for the deposition of a material thereon such as a substrate used to make a shield for use in a PVD or CVD process.

A further object of the present invention is to provide coated articles made using the method of the invention such as shields used in a PVD or CVD process.

Still other objects and advantages of the invention will in part be obvious and will in part be apparent from the specification.

SUMMARY OF THE INVENTION

Broadly stated the present invention provides a textured substrate surface for enhanced deposition of a metal or other material to the substrate. The textured surface is preferably uniform and/or a controlled shape (e.g., abutting spheres) to mechanically grip the deposition material and minimize stress build-up through thermal history. The invention also provides increased porosity for out-gassing without sacrificing adhesion to the substrate surface. Particulate generation is also minimized during the process.

The above and other objects, which will be apparent to one skilled in the art, are achieved in the present invention which relates in one aspect to a method for depositing a material on a substrate comprising the steps of:

providing a substrate for depositing a material on the surface thereof;

coating the surface of the substrate with first particles which are preferably spherical but can be any optimized controlled shape, to form a coated substrate having a first bonding textured surface corresponding to the shape of the first particles in an abutted and/or overlapping relationship;

coating the first bonding textured surface with second particles which are preferably spherical to form an adhesion layer, the second particles preferably being larger and/or having a higher melting point than the first particles;

heating the coated substrate to reflow the first particles forming a reflowed first bonding surface wherein the second particles preferably in substantially their original size and shape are embedded in the reflowed first bonding surface forming a second adhesive textured surface preferably corresponding to the shape of the second particles in an abutted and/or overlapping relationship; and coating a deposition material on the second adhesive textured surface to form the desired coated product.

In another aspect of the invention a method is provided for depositing a material on a substrate comprising the steps of:

providing a substrate for depositing a material on the surface thereof;

coating the surface of the substrate with first particles which are preferably spherical but can be any optimized controlled shape, to form a coated substrate having a first bonding textured surface corresponding to the shape of the first particles in an abutted and/or overlapping relationship;

heating the coated substrates to reflow the first particles forming a reflowed first bonding surface;

coating the reflowed first bonding surface with second particles which are preferably spherical but can be any optimized controlled shape, to form an adhesion layer, the second particles preferably being larger and/or having a higher melting point than the first particles;

heating the coated substrate to reflow the reflowed first bonding surface wherein the second particles preferably in substantially their original size and shape are embedded therein forming a second adhesive textured surface preferably corresponding to the shape of the second particles in an abutted and/or overlapping relationship; and coating a deposition material on the second adhesive textured surface to form the desired coated product.

In a further aspect of the invention, a method is provided for texturing the surface of a substrate to enhance the adhesion of a material to be deposited on the substrate comprising the steps of:

providing a substrate for depositing a material on the surface thereof;

coating the surface of the substrate with first particles which are preferably spherical but can be any optimized controlled shape, to form a coated substrate having a first bonding textured surface preferably corresponding to the shape of the first particles in an abutted and/or overlapping relationship;

coating the first bonding textured surface with second particles which are preferably spherical but can be any optimized controlled shape, to form an adhesion layer, the second particles preferably being larger and/or having a higher melting point than the first particles;

heating the coated substrate to reflow the first particles forming a reflowed first bonding surface wherein the second particles preferably in substantially their original size and shape are embedded in the reflowed first bonding surface forming a second adhesive textured surface preferably corresponding to the shape of the second particles in an abutted and/or overlapping relationship.

In a further aspect of the invention, a method is provided for texturing the surface of a substrate to enhance the adhesion of a material to be deposited on the substrate comprising the steps of:

providing a substrate for depositing a material on the surface thereof;

coating the surface of the substrate with first particles which are preferably spherical but can be any optimized controlled shape, to form a coated substrate having a first bonding textured surface corresponding to the shape of the first particles in an abutted and/or overlapping relationship;

heating the coated substrates to reflow the first particles forming a reflowed first bonding surface;

coating the reflowed first bonding surface with second particles which are preferably spherical but can be any optimized controlled shape, to form an adhesion layer, the second particles preferably being larger and/or having a higher melting point than the first particles;

heating the coated substrate to reflow the reflowed first bonding surface wherein the second particles preferably in substantially their original size and shape are embedded therein forming a second adhesive textured surface corresponding to the shapes of the second particles in an abutted and/or overlapping relationship.

In an additional aspect of the invention, an article made by the method of the invention is provided which has a textured surface suitable for depositing a material thereon with enhanced adhesive properties.

In a further aspect of the invention an article made by the method of the invention is provided which has a deposited material thereon and which article is suitable for use as a shield in a PVD or CVD apparatus and process.

BRIEF DESCRIPTION OF THE DRAWINGS

The features of the invention believed to be novel and the elements characteristic of the invention are set forth with particularity in the appended claims. The figures are for illustration purposes only and are not drawn to scale.

The invention itself, however, both as to organization and method of operation, may best be understood by reference to the detailed description which follows taken in conjunction with the accompanying drawings in which.

DESCRIPTION OF THE PREFERRED EMBODIMENT(S)

Figure 1A:
FIGS. 1A–1F show a sequence of steps for forming a coated substrate according to a method of the invention.

In describing the preferred embodiment of the present invention, reference will be made herein to FIGS. 1A–2F of the drawings in which like numerals refer to like features of the invention. Features of the invention are not necessarily shown to scale in the drawings.

Any suitable substrate may be coated with any suitable deposition material using the method of the invention and such substrates include plastics, metals, ceramics, composites, glass and quartz. Likewise, any suitable deposition material may be used to coat the substrate and include paints, metals, ceramics, plastics and polymers. Metals which can be deposited include aluminum, titanium, tantalum, copper, metal-nitrides and tungsten or various other metals or metal alloys or combinations. For convenience the following description will be directed to the deposition of aluminum onto a stainless steel substrate to form a textured substrate which textured substrate is then coated with a metal such as titanium or tantalum to make an article used as a shield in a PVD or CVD apparatus and process.

In one aspect of the invention, a substrate to be coated with a deposition material is coated with a first layer of first controlled size spheres. Other second controlled sized spheres, preferably larger, are then deposited on top of the first layer of spheres forming a second layer of spheres. The substrate is then heated to reflow the first layer of spheres which reflowed layer embeds the second spheres therein. The second spheres may exhibit a small amount of reflow but essentially maintain their shape and size so that a textured surface corresponding to the shape of abutted and/or overlapping spheres is maintained after the reflow process. The textured substrate may then be deposited with any suitable material to form the desired end product. The second spheres may also have a higher melting point than the first spheres to avoid reflow.

Referring to FIG. 1A, this aspect of the invention is shown in which substrate 10 has an upper surface 10a onto which a material is to be deposited to form an article such as a PVD shield.

Figure 1B:
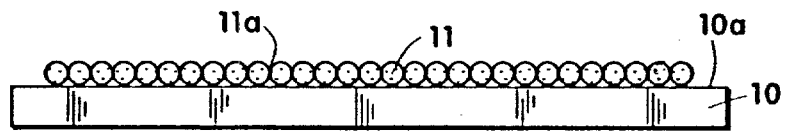

In FIG. 1B, the substrate 10 is shown coated with first spheres 11 on the surface 10a of substrate 10. The first spheres 11 form a surface texture 11a which corresponds to the shape of abutted first spheres 11.

The coating of spheres 11 on substrate 10 may be performed using any suitable process including electrostatic spraying, fluidized bed, spray coating and arc spraying.

In one particular application, the first controlled spheres 11 are aluminum and are deposited on the substrate 10 by spray coating. Spheres 11 may vary in size and to make a shield will generally be about 500 to 1000 microns in diameter.

Figure 1C:
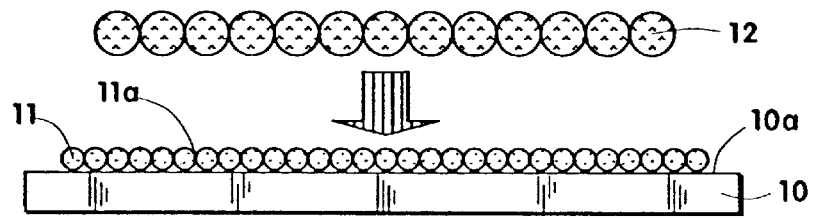

FIG. 1C shows the deposition of second layer of second controlled spheres 12 onto the first textured surface 11a.

Figure 1D:
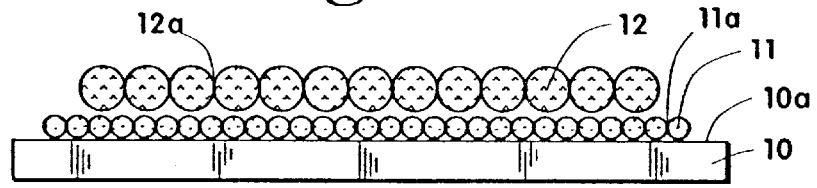

FIG. 1D shows the second particles 12 on the surface 11a of particles 11 forming a textured surface 12a which corresponds generally to the shape of abutted spherical second particles 12.

As with deposition of the first spheres 11, the second controlled spherical particles 12 may be deposited using the same suitable means. The second spheres 12 are also aluminum and are shown larger in diameter, and form a layer 12a on top of surface 11a. The second spheres will generally be about 1500 to 2500 microns in diameter.

Figure 1E:
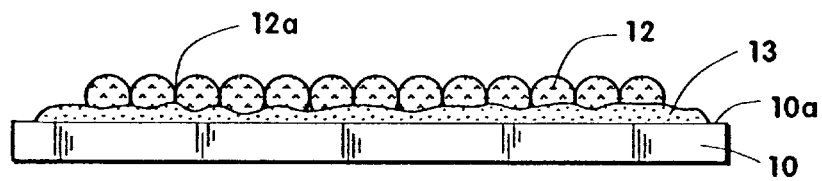

FIG. 1E shows the next step in the process wherein the first spheres 11 are reflowed to form a reflowed layer 13 on the surface 10a of substrate 10. It can be seen that the second spheres 12 are higher than the height of the reflowed layer 13 and are embedded in the reflowed layer and essentially retain their original shape and size forming a textured surface 12a corresponding to abutted spheres.

It is contemplated herein that the second spheres 12 may exhibit some reflow during the reflow of the first textured layer 11 but it is preferred that the heating be controlled so that any second sphere reflow be minimal so that the second spherical particles 12 essentially retain their original shape and size.

Figure 1F:
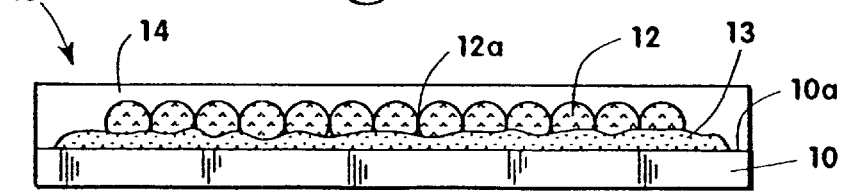

FIG. 1F shows a final coated product 15 comprising a substrate 10, reflowed layer 13, a second sphere embedded layer 12 and a deposition material 14. The coated structure 15 shown in FIG. 1F exhibits high adhesion between the coating 14 and the substrate 10 and a coating which is relatively stress free.

The deposition coating 14 may be any suitable material such as titanium, copper, tantalum or tungsten and may be applied using any suitable technique as discussed above.

In another aspect of the invention the texturing method uses metal spheres which are applied to the substrate in two steps. First a thin aluminum layer of aluminum spheres would be deposited on the surface of an underlying material either by spraying, fluidized bed, electrostatic methods, etc. and then the deposited underlying material is heated to flow (reflow) the aluminum spheres into a smooth surface. The other second spheres are then applied by spraying, fluidized bed, electrostatic, etc. and the deposited underlying material is again heated to reflow only the first aluminum reflow surface which then adheres to and embeds the second spheres therein and bonds the second spheres to the reflowed aluminum surface. There may be a combination of materials for the spheres and underlying surface substrate for optimized adhesion and thermal characteristics.

With a controlled substrate surface texture shape characterized by spheres or abutted and/or overlapping spheres, the deposited material to make the final product will be applied uniformly over the sphere textured surface. The spheres will act as grips to hold the deposited material and minimize stress concentrations therein and provides a ductile bonding surface to accommodate thermal movements of the substrate and reduced particulate deposit shedding during operation of the PVD process.

The size of the first and second spheres can be optimized in either of the above methods to the adhesion and the thermal properties of the deposition materials. The second spheres are preferably larger in diameter than the first spheres and are embedded so that the top of the spheres is above the reflowed surface forming a textured surface corresponding to abutted and/or overlapping spheres. The reflow heating is controlled to minimize melting of the larger second spheres so that the second spheres essentially retain their original size and shape. The second spheres may also have a higher melting point to avoid reflow.

The above method may be demonstrated by reference to FIGS. 2A–2F.

Figure 2A:
FIGS. 2A–2F show a sequence of steps for forming a coated substrate according to another method of the invention.
Figure 2B:
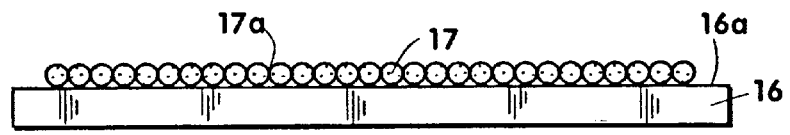

In FIG. 2A, a substrate 16 is shown having an upper surface 16a. In FIG. 2B, spheres 17 are deposited on upper surface 16a forming a first layer having a surface 17a.

Figure 2C:
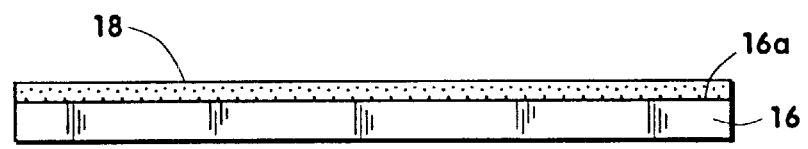

In FIG. 2C, spheres 17 are reflowed forming a reflow layer 18 on surface 16a of substrate 16.

Figure 2D:
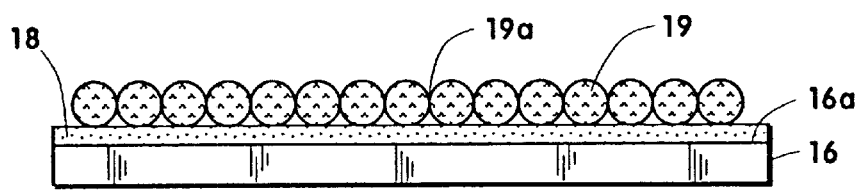
Figure 2E:
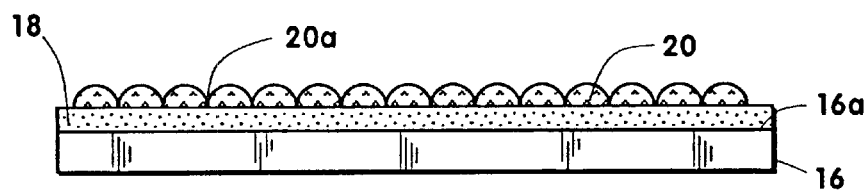
Figure 2F:
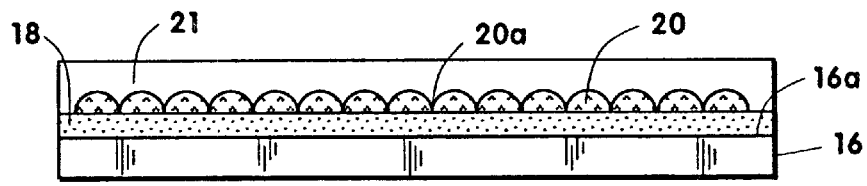

In FIG. 2D, second spheres 19 are deposited on reflow layer 18 and form a textured surface 19a corresponding to abutted spheres. In FIG. 2E, the substrate is again heated to reflow layer 18 embedding spheres 19 therein with the spheres 19 now being identified as embedded spheres 20. As can be seen, the embedded spheres 20 essentially maintain their spherical shape and size and form a textured surface identified as 20a corresponding to abutted spheres. In FIG. 2F, a deposition layer 21 is deposited on embedded spheres 20 forming a final product 22.

While the above invention has been described using spheres it will be appreciated to those skilled in the art that any suitable shape first materials can be used to form a reflow layer in which is embedded second shaped materials forming a textured surface. Accordingly, the particles can be angular, irregular and square, with the proviso that the second material not substantially reflow and substantially maintain its shape and size during the reflow process to form a textured surface and be of a height above the level of the reflow surface so as to form a textured surface. While the textured surface will typically be in the form of abutted and/or overlapping particles, it will be appreciated by those skilled in the art that the particles may also be spaced apart or any other such spacing forming a textured surface.

It is an important feature of the invention that the second spheres are embedded in and protrude above the top of the reflowed layer. This can be accomplished by using a single layer of spheres of different diameters. The volume of the larger spheres will therefore be larger than the volume of the smaller spheres so that the reflowed layer thickness will be less than the height of the larger spheres. In general, the amount of each spheres used will be to form a reflowed layer which has a thickness so that the second spheres protrude above the top of the reflowed layer.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for depositing a material on a substrate comprising the steps of:
   providing a substrate for depositing a material on the surface thereof;
   coating the surface of the substrate with first particles to form a coated substrate having a first bonding textured surface corresponding to the shape of the first particles in an abutted and/or overlapping relationship;
   coating the first bonding textured surface with second particles to form an adhesion layer, the second particles being larger and/or having a higher melting point than the first particles;
   heating the coated substrate with the second particles thereon to reflow the first particles forming a reflowed first bonding surface wherein the second particles are embedded in the reflowed first bonding surface forming an adhesive textured surface corresponding to the shape of the second particles in an abutted and/or overlapping relationship; and
   coating a deposition material on the second adhesive textured surface to form the desired coated product.

2. The method of claim 1 wherein both the first and second particles are spherical.

3. The method of claim 2 wherein both the first and second particles are aluminum.

4. The method of claim 3 wherein both the first and second particles are applied by spray coating.

5. A method for depositing a material on a substrate comprising the steps of:
   providing a substrate for depositing a material on the surface thereof;
   coating the surface of the substrate with first particles to form a coated substrate having a first bonding textured surface corresponding to the shape of the first particles in an abutted and/or overlapping relationship;
   heating the coated substrate to reflow the first particles forming a reflowed first bonding surface;
   coating the reflowed first bonding surface with second particles to form an adhesion layer, the second particles being larger and/or having a higher melting point than the first particles;
   heating the coated substrate with the second particles thereon to reflow the reflowed first bonding surface wherein the second particles are embedded therein forming an adhesive textured surface corresponding to the shape of the second particles in an abutted and/or overlapping relationship; and
   coating a deposition material on the adhesive textured surface to form the desired coated product.

6. The method of claim 5 wherein both the first and second particles are spherical.

7. The method of claim 6 wherein both the first and second particles are aluminum.

8. The method of claim 7 wherein both the first and second particles are applied by spray coating.

9. A method for texturing the surface of a substrate to enhance the adhesion of a material to be deposited on the substrate comprising the steps of:
   providing a substrate for depositing a material on the surface thereof;
   coating the surface of the substrate with first particles to form a coated substrate having a first bonding textured surface corresponding to the shape of the first particles in an abutted and/or overlapping relationship;
   coating the first bonding textured surface with second particles to form an adhesion layer, the second particles being larger and/or having a higher melting point than the first particles;
   heating the coated substrate with the second particles thereon to reflow the first particles forming a reflowed first bonding surface wherein the second particles are embedded in the reflowed first bonding surface forming an adhesive textured surface corresponding to the shape of the second particles in an abutted and/or overlapping relationship.

10. The method of claim 9 wherein both the first and second particles are spherical.

11. The method of claim 10 wherein both the first and second particles are aluminum.

12. The method of claim 11 wherein both the first and second particles are applied by spray coating.

13. A method for texturing the surface of a substrate to enhance the adhesion of a material to be deposited on the substrate comprising the steps of:

provided a substrate for depositing a material on the surface thereof;

coating the surface of the substrate with first particles to form a coated substrate having a first bonding textured surface corresponding to the shape of the first particles in an abutted and/or overlapping relationship;

heating the coated substrates to reflow the first particles forming a reflowed first bonding surface;

coating the reflowed first bonding surface with second particles to form an adhesion layer, the second particles being larger and/or having a higher melting point than the first particles;

heating the coated substrate with the second particles thereon to reflow the reflowed first bonding surface wherein the second particles are embedded therein forming an adhesive textured surface corresponding to the shapes of the second particles in an abutted and/or overlapping relationship.

14. The method of claim 13 wherein both the first and second particles are spherical.

15. The method of claim 14 wherein both the first and second particles are aluminum.

16. The method of claim 15 wherein both the first and second particles are applied by spray coating.

* * * * *